United States Patent
Cheng et al.

(10) Patent No.: US 9,228,114 B2
(45) Date of Patent: Jan. 5, 2016

(54) COMPOSITION AND METHOD FOR CHEMICAL MECHANICAL POLISHING

(71) Applicant: TAIWAN SEMICONDUCTOR MANUFACTURING COMPANY LTD., Hsinchu (TW)

(72) Inventors: Chung-Liang Cheng, Changhua County (TW); Yen-Yu Chen, Taichung (TW); Chang-Sheng Lee, Shin-Chu (TW); Wei Zhang, Chupei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 6 days.

(21) Appl. No.: 14/109,844

(22) Filed: Dec. 17, 2013

(65) Prior Publication Data

US 2015/0166837 A1    Jun. 18, 2015

(51) Int. Cl.
| | |
|---|---|
| H01L 21/461 | (2006.01) |
| B44C 1/22 | (2006.01) |
| C09G 1/02 | (2006.01) |
| H01L 21/3105 | (2006.01) |
| B24B 37/04 | (2012.01) |

(52) U.S. Cl.
CPC ............. *C09G 1/02* (2013.01); *B24B 37/044* (2013.01); *H01L 21/31053* (2013.01)

(58) Field of Classification Search
USPC .......... 216/88, 89, 84, 85; 438/692, 693
See application file for complete search history.

(56) References Cited

U.S. PATENT DOCUMENTS

| | | | |
|---|---|---|---|
| 5,483,568 A * | 1/1996 | Yano et al. | 438/16 |
| 5,667,424 A * | 9/1997 | Pan | 451/6 |
| 6,307,628 B1 * | 10/2001 | Lu et al. | 356/124 |
| 6,466,642 B1 * | 10/2002 | Meloni | 378/44 |
| 7,565,084 B1 * | 7/2009 | Wach | 398/201 |
| 8,734,661 B2 * | 5/2014 | Yamauchi et al. | 216/53 |
| 2009/0107851 A1 * | 4/2009 | Kodera et al. | 205/656 |
| 2010/0187200 A1 * | 7/2010 | Spiro et al. | 216/53 |

* cited by examiner

*Primary Examiner* — Shamim Ahmed
(74) *Attorney, Agent, or Firm* — Chun-Ming Shih (57) ABSTRACT

A composition for chemical mechanical polishing includes a plurality of particles and a plurality of abrasive particles. Each of the plurality of particles includes a body and a functional group. The body is configured to transfer energy of an incident light into a plasmonic wave. The functional group is configured to bind onto a metal containing layer.

20 Claims, 10 Drawing Sheets

COMPOSITION AND METHOD FOR CHEMICAL MECHANICAL POLISHING

FIELD

The disclosure relates to a composition and a method for chemical mechanical polishing.

BACKGROUND

Numerous integrated circuits are typically fabricated simultaneously on a single semiconductor wafer. At certain stages of fabrication, it is often necessary to polish a surface of the semiconductor wafer. In general, a semiconductor wafer is polished to remove high topography, and surface defects such as crystal lattice damage, scratches, roughness, or embedded particles of dirt or dust. This polishing process is often referred to as chemical mechanical planarization (CMP) and is utilized to improve the quality and reliability of semiconductor devices.

The conventional CMP process utilizes endpoint detection techniques or predetermined fixed-time polishing techniques to determine when to stop polishing. Both of these polishing stop techniques produce non-uniformities across the polished surface due to polishing rate variations. In addition, over-polishing, meaning excessive thinning of a functional layer, causes the functional layer to become too thin to be operated on. Thus, an improved composition or method for CMP processing is still in great demand.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

A more complete understanding of the present disclosure may be derived by referring to the detailed description and claims when considered in connection with the Figures, where like reference numbers refer to similar elements throughout the Figures, and:

DETAILED DESCRIPTION OF THE INVENTION

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

Endpoint detection techniques are required to detect an optical reflection from an endpoint layer or a stop layer to avoid over-polishing. The optical reflection is sometimes too weak to be detected because a thickness of the endpoint layer is thinned for certain requirements. In the present disclosure, several particles are provided to attach on a surface of the endpoint layer and are capable of transferring optical waves into plasmon-related energy, which is absorbed to generate a fluorescence so as to enhance the optical reflection.

In various embodiments, since these particles are accumulated on the surface of the endpoint layer that is exposed by the polishing process, a luminous flux of the fluorescence increases enough to be detected in order to stop the polishing process. By such design, over-polishing of the endpoint layer is avoided. In some embodiments, the surface of the endpoint layer transfers the plasmon-related energy into the fluorescence, and thus the fluorescence is not detected until the surface of the endpoint layer is exposed under an incident light.

In describing and claiming the present disclosure, the following terminology will be used in accordance with the definitions set forth below.

As used herein, a "substrate" refers to a bulk substrate on which various layers and device structure are formed. In some embodiments, the bulk substrate includes silicon or a compound semiconductor, such as GaAs, InP, Si/Ge, or SiC. Examples of the layers include dielectric layers, doped layers, polysilicon layers, or conductive layers. Examples of the device structures include transistors, resistors, and/or capacitors, which are interconnected through an interconnect layer to additional integrated circuits. In some embodiments, the bulk substrate includes a wafer such as a polished wafer, an epi wafer, an argon anneal wafer, a hai wafer and a silicon on insulator (SOI) wafer.

As used herein, a "semiconductor substrate" refers to a chip carrier, which is generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation. Active electrical components, such as transistors, have the ability to control the flow of electrical current. Passive electrical components, such as capacitors, inductors, resistors, and transformers, create a relationship between voltage and current that is necessary to perform electrical circuit functions.

As used herein, "active and passive components" refers to components, which are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers are formed by a variety of deposition techniques determined in part by the type of material being deposited. For example, thin film deposition involves chemical vapor deposition (CVD), physical vapor deposition (PVD), electrolytic plating, and electroless plating processes. Each layer is generally patterned to form portions of active components, passive components, or electrical connections between components. The layers are patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

As used herein, "back-end manufacturing" refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual dies are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

As used herein, a "plasmonic wave," "surface plasmon resonance" or "plasmonic beam" recited in the present disclosure is a collective oscillation of electrons in a solid or liquid that is stimulated by incident light. The resonance condition is established when the frequency of the incident light photons matches the natural frequency of surface electrons oscillating against the restoring force of positive nuclei. The "plasmonic wave," "surface plasmon resonance" or "plasmonic beam" in nanometer-sized structures is known as "localized surface plasmon resonance."

As used herein, a "slurry" recited in the present disclosure is a watery mixture of insoluble matter. The insoluble matter includes abrasive particles and certain functional particles in accordance with features of embodiments.

As used herein, an "abrasive particle" recited in the present disclosure is an object dispersed in acidic or basic solution. The abrasive particles have a size distribution which directly affects critical metrics, including rate of removal and wafer defects. Particle size analysis is therefore a key indicator of CMP slurry performance. In some embodiments, the typical size range of the abrasive particles is about 50 nanometers to about 175 nanometers and several particle sizing techniques are capable of measuring in this range with varying accuracy and precision.

As used herein, a "film" recited in the present disclosure is an object deposited on an endpoint layer. In some embodiments, the film is consisting of a group selected from oxide, metal oxide, nitride, phosphosilicate glass (PSG), tetra-ethyl-ortho-silicate (TEOS) oxide, Black Diamond® (Applied Materials of Santa Clara, Calif.), amorphous fluorinated carbon, low-k dielectric materials and borophosphosilicate glass (BPSG). Examples of the oxide are selected from silicon dioxide ($SiO_2$) and phosphorus pentoxide ($P_4O_{10}$), selenium dioxide ($SeO_2$), sulfur trioxide ($SO_3$). Examples of the metal oxide are selected from zinc oxide (ZnO), aluminium oxide ($Al_2O_3$), iron (II,III) oxide ($Fe_3O_4$), calcium oxide (CaO), ruthenium tetroxide ($RuO_4$), osmium (VIII) oxide ($OsO_4$), iridium tetroxide ($IrO_4$), indium tin oxide ($In_2O_3:SnO_2$), xenon tetroxide ($XeO_4$), nickel oxide, titanium oxide, hafnium oxide, zirconium oxide, tungsten oxide, tantalum oxide, molybdenum oxide and copper oxide. Examples of the nitride are selected from silicon nitride ($Si_3N_4$), titanium nitride (TiN), silicon oxynitride ($Si_2N_2O$), thallium (I) nitride ($Tl_3N$), magnesium nitride ($Mg_3N_2$), beryllium nitride ($Be_3N_2$), calcium nitride ($Ca_3N_2$) and strontium nitride ($Sr_3N_2$).

As used herein, a "fluorescence" recited in the present disclosure is the emission of light by a substance that has absorbed light or other electromagnetic radiation. In some embodiments, the fluorescence is a form of luminescence. In certain embodiments, the emitted light has a longer wavelength, and therefore lower energy, than the absorbed radiation. However, in other embodiments, when the absorbed electromagnetic radiation is intense, it is possible for one electron to absorb two photons; this two-photon absorption leads to emission of radiation having a shorter wavelength than the absorbed radiation. In still other embodiments, the emitted radiation has the same wavelength as the absorbed radiation, termed "resonance fluorescence."

Figure 1:
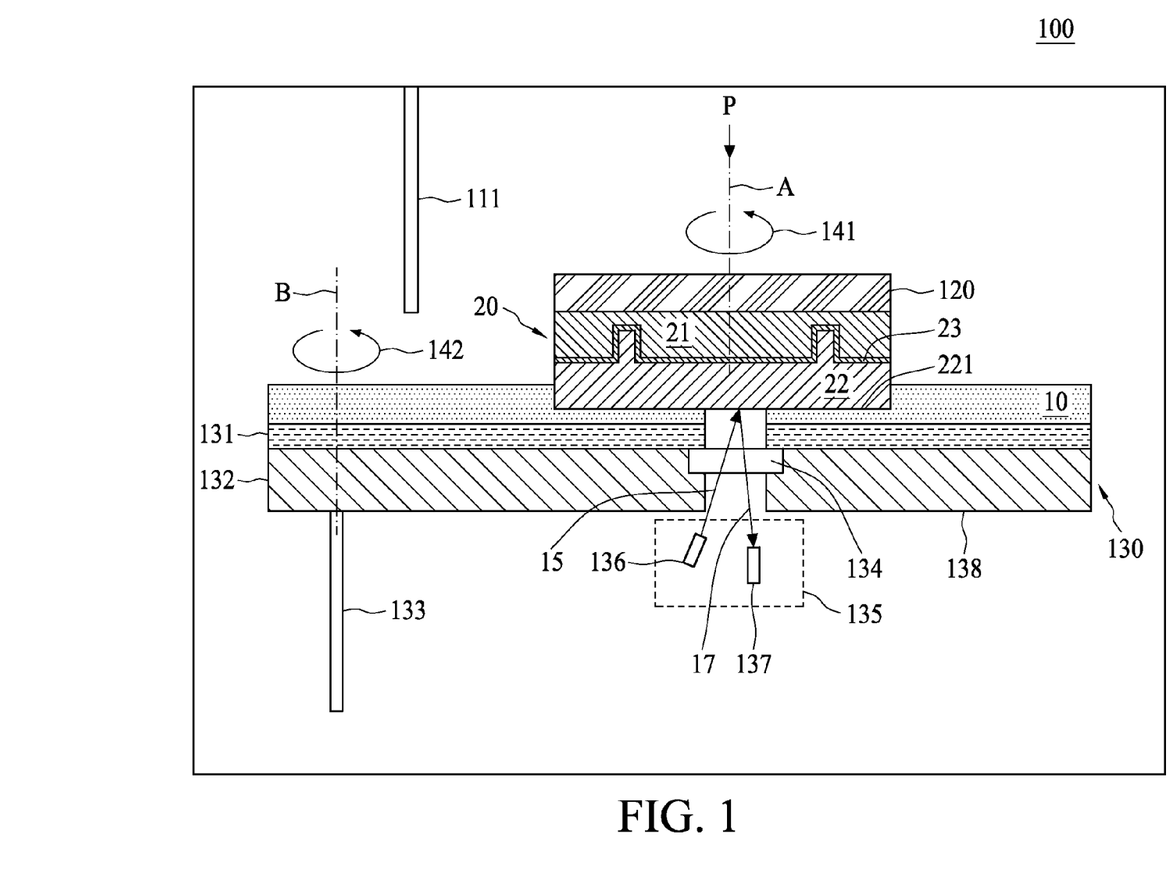
FIG. 1 is a schematic view of an apparatus including a carrier, a polishing table, a platen, a polishing pad, a viewing window, and a monitor device according to some embodiments of the present disclosure.

In some embodiments, as in FIG. 1, an apparatus 100 for chemical mechanical polishing (CMP) of a workpiece or semiconductor substrate 20 includes a patterned base layer 21, a film 22 and a metal containing layer 23. The patterned base layer 21 is formed for the subsequent formation of metal lines, contact/via studs, and/or pads. The metal containing layer 23 acts as an endpoint layer is compliant to the morphology of the patterned base layer 21. The film 22 is disposed on the metal containing layer 23 and configured to cover the metal containing layer 23. In certain embodiments, it should be noted that the semiconductor substrate 20 has been preprocessed and therefore includes layers of interleaved circuitry. For simplicity, the other features are not represented in FIG. 1.

In some embodiments, the apparatus 100 includes a carrier 120 including a suitable means for securing the semiconductor substrate 20 thereto. As shown in FIG. 1, the semiconductor substrate 20 is positioned between the carrier 120 and a polishing table 130. The carrier 120 is intended to be mounted by a suitable means above the polishing table 130 for rotation of an axis A in a direction indicated by an arrow 141. The carrier 120 is configured to be positionable between a polishing position and a non-polishing position by a suitable control means (not shown) according to a start/stop signal. In the polishing position, the carrier 120 is positioned so that a polishing surface 221 is in polishing contact with a polishing pad 131 of the polishing table 130, and further, the carrier 120 exerts an appropriate pressure P upon the polishing pad 131. In the non-polishing position, the carrier 120 is positioned so that the polishing surface 221 is moved away from the polishing pad 131, thereby effectively terminating the polishing process.

In some embodiments, the polishing table 130 includes a platen 132 and the polishing pad 131. The polishing pad 131 has a thickness on the order of 50 mils (1 mil=0.001 inches). The polishing table 130 rotates via a table spindle 133, and a corresponding electrically controllable motor (not shown), at an axis B in a direction indicated by an arrow 142.

Referring to FIG. 1, the platen 132 further includes a viewing window 134, embedded within the polishing table 130 at a prescribed location. The viewing window 134 is configured to enable in-situ viewing of the polishing surface 221 of the semiconductor substrate 20 during polishing. In some embodiments, the viewing window 134 allows viewing of the polishing surface 221 from an underside 138 of the polishing table 130, upon the viewing window 134. While one viewing window 134 is shown, more than one may be included.

In some embodiments, the apparatus 100 further includes a monitor device 135 configured for monitoring a polishing process during polishing of the semiconductor substrate 20. The monitor device 135 further includes a detector 137 and a light source 136 providing an incident light 15 at a prescribed incident angle for transmission of the incident light 15 through the viewing window 134. The detector 137 is configured to detect an amount of reflected fluorescence 17 reflected from the metal containing layer 23 and back through the viewing window 134. The detector 137 is capable of generating the stop signal to terminate polishing once the detector 137 senses the fluorescence, and thus the over-polishing of the metal containing layer 23 is avoided.

In some embodiments, the apparatus 100 includes a tube 111 for providing a polishing slurry or a composition 10. The composition 10 is used to flow over the polishing pad 131 and includes several abrasive particles 11 for grinding and flushing away unwanted film material, to be further discussed herein below.

Figure 2:
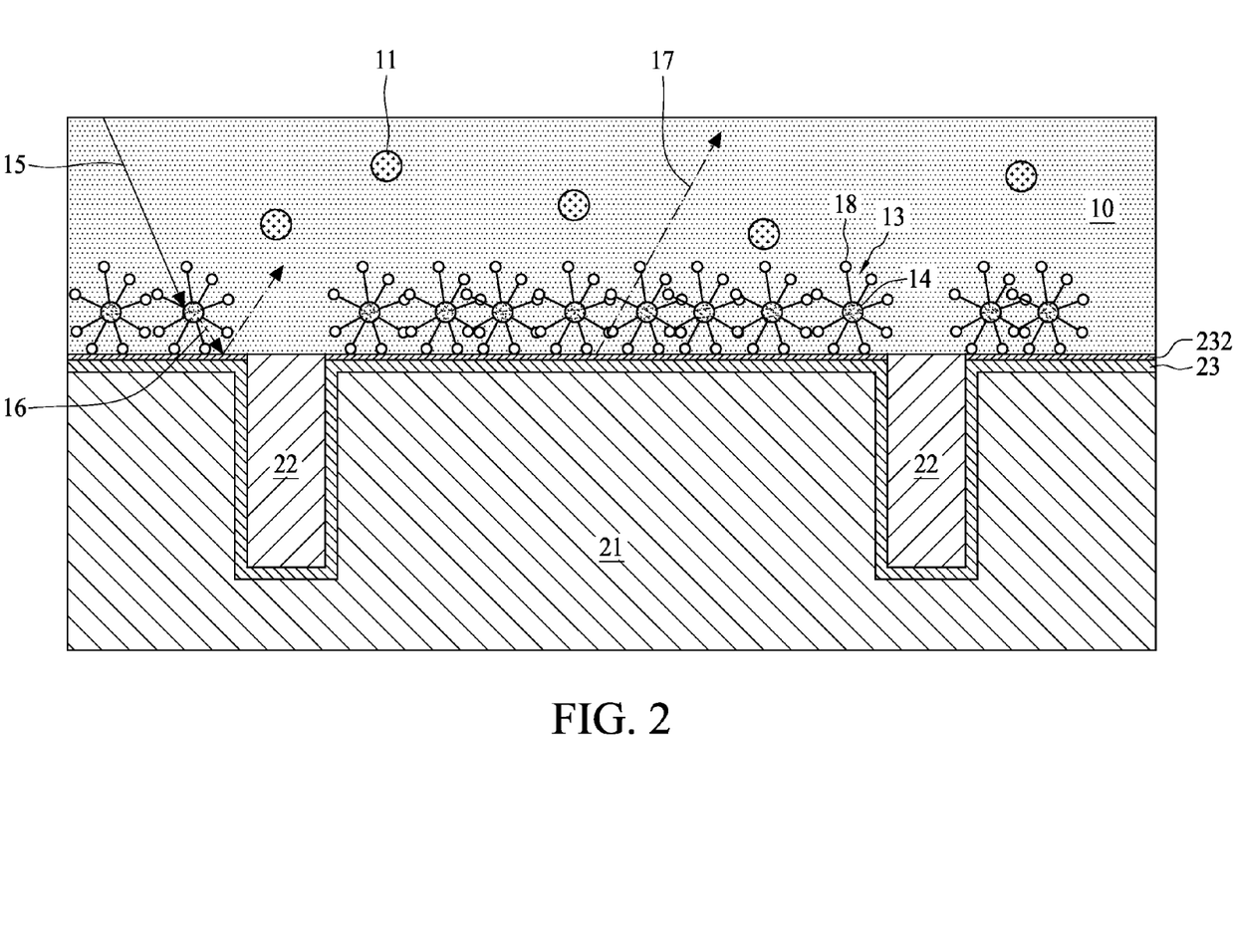
FIG. 2 is a cross-sectional view of a composition including abrasive particles and particles, wherein the particles are attached on the metal containing layer according to some embodiments of the present disclosure.

In some embodiments as in FIG. 2, the composition 10 for chemical mechanical polishing includes several particles 13 and abrasive particles 11. A diameter of the abrasive particles 11 is adjusted from about 50 nm to about 95 nm, according to the thickness of the film 22. In certain embodiments, the diameter of the abrasive particles 11 is from about 25 nm to about 77 nm. In other embodiments, the diameter of the abrasive particles 11 is from about 10 nm to about 82 nm. In still other embodiments, the diameter of the abrasive particles 11 is about 31 nm to about 175 nm.

In some embodiments, the proportion of weight of the abrasive particles 11 to the total weight of the composition 10 is adjusted according to the property of the film 22. In some embodiments, the abrasive particles 11 are from about 1% to about 3% of the composition 10 by weight. In certain embodiments, the abrasive particles 11 are from about 2.5% to about 7% of the composition 10 by weight. In other embodiments, the abrasive particles 11 are from about 4% to about 10% of the composition 10 by weight. In still other embodiments, the abrasive particles 11 are from about 5% to about 9% of the composition 10 by weight.

Referring to FIG. 2, each of the particles 13 of the composition 10 includes a functional group 18 and a body 14, which is configured to transfer energy of the incident light 15 into a plasmonic wave 16. The plasmonic wave 16 is generated when a frequency of the incident light 15 photons matches a natural frequency of surface electrons oscillating against the restoring force of positive ions of a metal. The metal of the body 14 includes aluminum (Al), chromium (Cr), molybdenum (Mo), platinum (Pt), tantalum (Ta), silver (Ag), titanium (Ti), tungsten (W) or a combination thereof. In this case, the frequency of the incident light 15 is within the ultraviolet range to generate the plasmonic wave 16. However, in certain embodiments, the body 14, including a metal such as copper (Cu) or gold (Au), has electronic interband transitions within the visible range, whereby specific light energies (colors) are absorbed to generate the plasmonic wave 16.

In some embodiments as in FIG. 2, the functional group 18 of each of the particles 13 is configured to bind onto the metal containing layer 23. The functional group 18 includes —COOH, —SO$_3$H, —NH$^+$, —OH, or a combination thereof so as to form an electromagnetic attractive interaction with the metal containing layer 23. In certain embodiments, the functional group 18 consists of a group selected from and In some embodiments as in FIG. 2, the metal containing layer 23 further includes a native oxide layer 232, which is much thinner than the metal containing layer 23. A thickness of the metal containing layer 23 is from about 10 Å to about 20 Å, while the native oxide layer 232 is from about 1 Å to about 2 Å. In certain embodiments, the metal containing layer 23 is from about 14 Å to about 28 Å, while the native oxide layer 232 is from about 1.2 Å to about 2.1 Å. In other embodiments, the metal containing layer 23 is from about 21 Å to about 36 Å, while the native oxide layer 232 is from about 1.4 Å to about 2.3 Å. In still other embodiments, the metal containing layer 23 is from about 32 Å to about 50 Å, while the native oxide layer 232 is from about 1.9 Å to about 3 Å.

In some embodiments, the metal containing layer 23 also includes titanium nitride (TiN) or tantalum nitride (TaN), which the native oxide layer 232 is on. The native oxide layer 232 includes several oxygen atoms, which are configured to electromagnetically attract with the function group 18.

A method for chemical mechanical polishing is used to detect the fluorescence reflected from the metal containing layer so as to prevent over-polishing. The method includes a number of operations and the description and illustrations are not deemed as a limitation as to the order of the operations.

A term "depositing" or "deposited" is used in the present disclosure to describe an operation of locating materials on a substrate using a vapor phase of a material to be deposited, a precursor of the material, an electrochemical reaction, or sputtering/reactive sputtering. The depositing operation includes various steps and processes and varies in accordance with the features of the embodiments. In some embodiments, depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using an electrochemical reaction include electroplating, electroless plating, and the like. Other examples of deposition include pulse laser deposition (PLD), and atomic layer deposition (ALD).

A term "oxidizing" or "oxidized" is used in the present disclosure to describe an operation of incorporating one oxygen atom into a chemical compound with other elements. The oxidizing operation includes various steps and processes and varies in accordance with the features of embodiments. In certain embodiments, the oxidizing operation includes forming stable chemical bonds with the object. For instance, the oxidation uses oxygen, within a temperature from about 1000° C. to about 1200° C., within about 200 sec to about 400 sec (about 50 CC to about 100 CC) in the substrate. A high and a low temperature are traded off for a short duration and a long duration for the operation, respectively.

A term "dispensing" or "dispensed" is used in the present disclosure to describe an operation of delivering a stream of slurry or composition to an object. The distributing operation includes various steps and processes and varies in accordance with the features of the embodiments. In some embodiments, the distributing operation includes stirring the stream of small drops of slurry or composition in the air.

A term "binding" or "bound" is used in the present disclosure to describe an operation of forming an electromagnetic attractive interaction between polar molecules. The binding operation includes various steps and processes and varies in accordance with the features of embodiments. In some embodiments, the binding operation includes forming a hydrogen bond, covalent bond, or ionic bond between two molecules.

Figure 3:
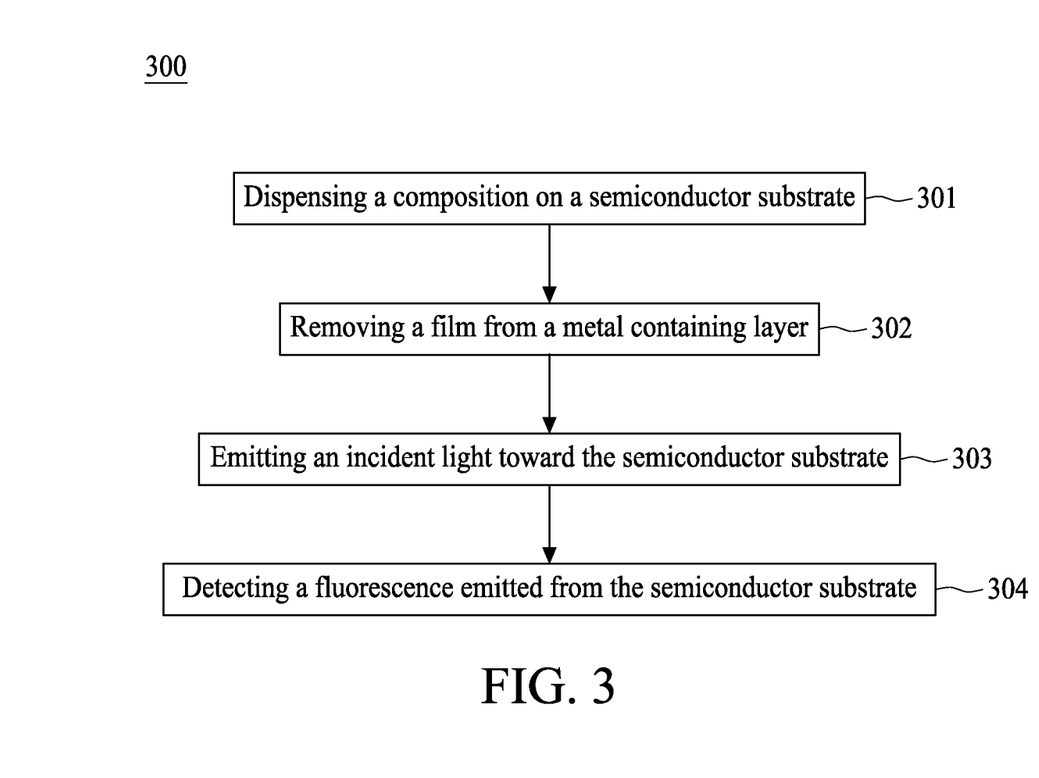
FIG. 3 is a flowchart of a method for dispensing a composition on a semiconductor substrate and removing a film from the metal containing layer according to some embodiments of the present disclosure.

FIG. 3 is a diagram of a method 300 for chemical mechanical polishing in accordance with some embodiments of the present disclosure. The method 300 includes several operations, which are discussed in detail with reference to FIGS. 4 to 5. At operation 301, a composition is dispensed on a semiconductor substrate, which includes a metal containing layer and a film atop the metal containing layer. At operation 302, the film is removed from the metal containing layer. At operation 303, an incident light is emitted toward the semiconductor substrate. At operation 304, a fluorescence emitted from the semiconductor substrate is detected.

Figure 4:
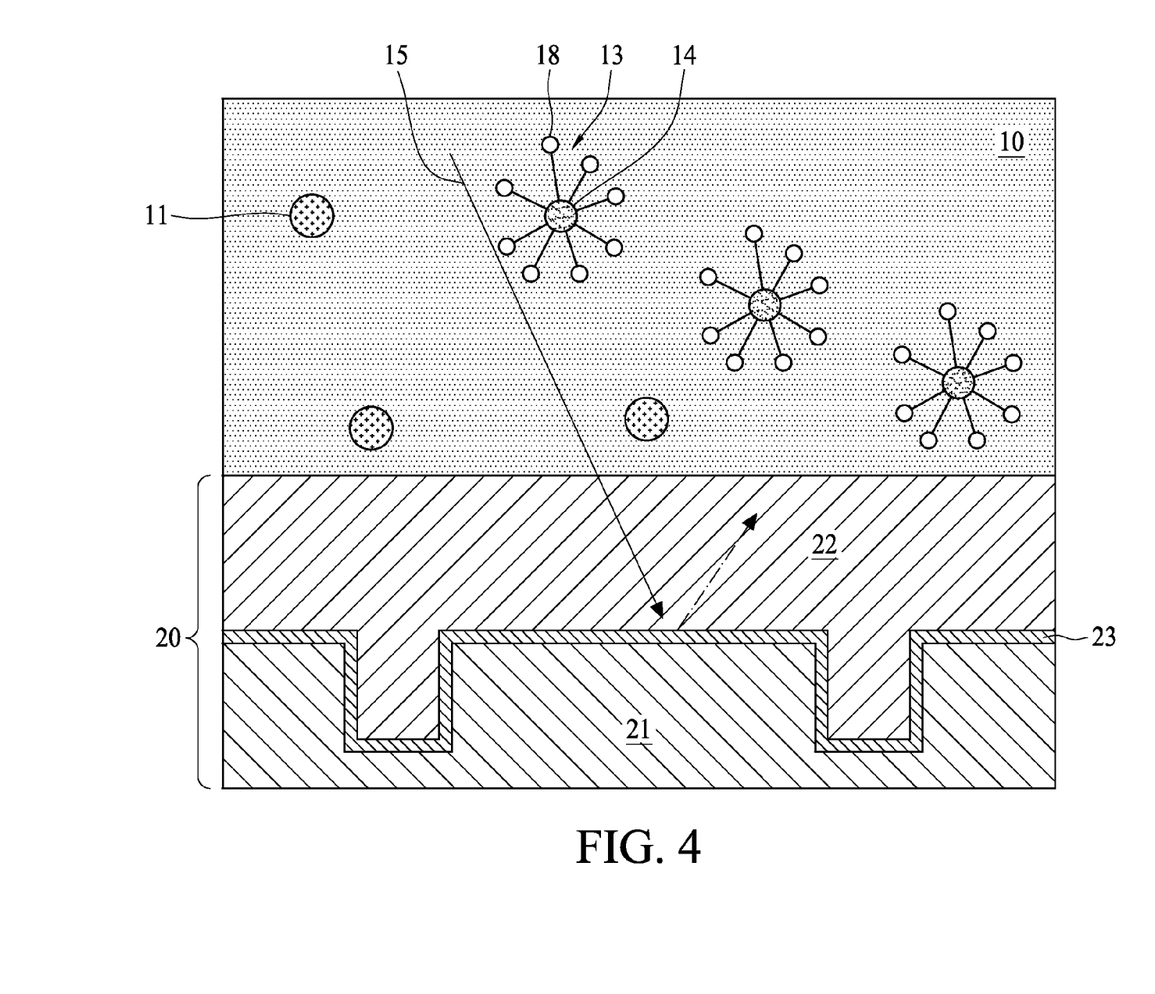
FIG. 4 is a cross-sectional view of a semiconductor substrate ground by abrasive particles in a composition, which includes particles to attach on the metal containing layer atop the patterned base layer in accordance with some embodiments of the present disclosure.
Figure 5:
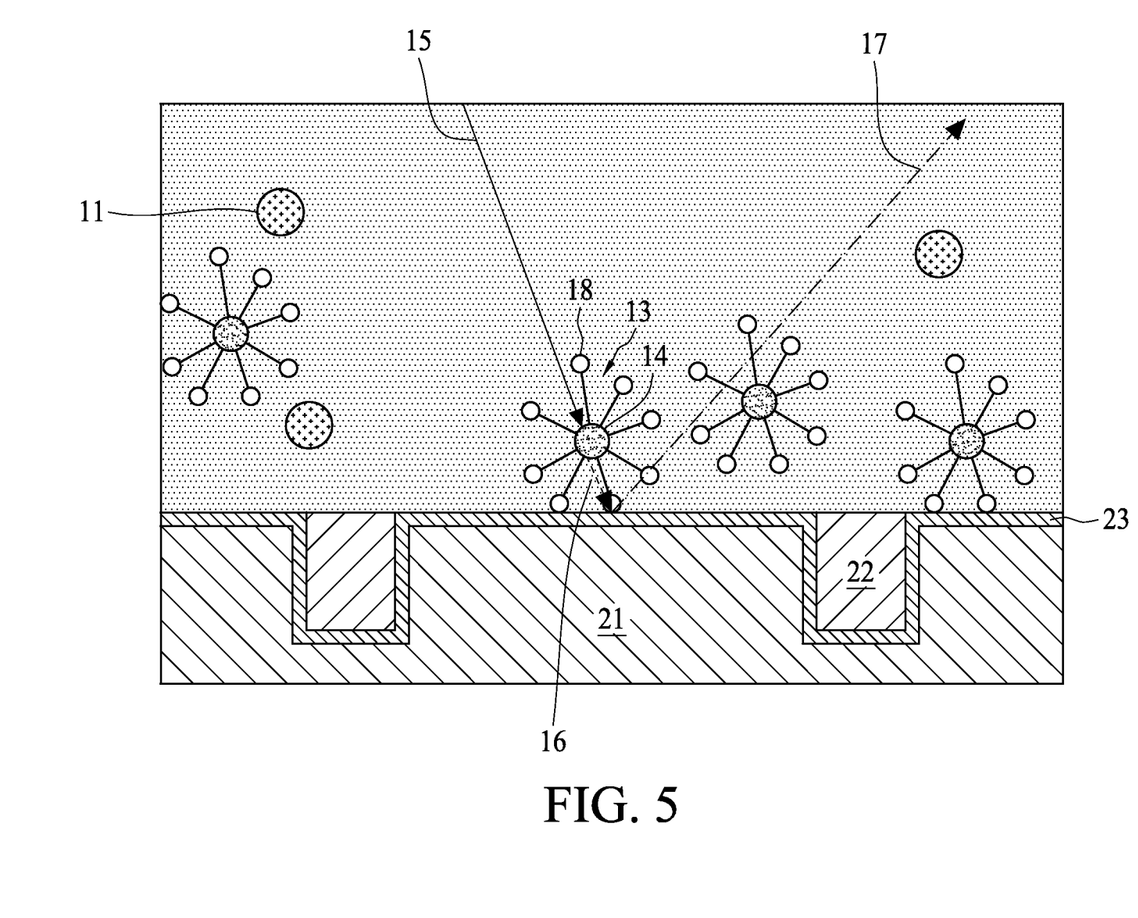
FIG. 5 is a cross-sectional view of the film atop the metal containing layer, which is polished or ground so as to allow the plasmonic particles to attach on the surface of the metal containing layer in accordance with some other embodiments of the present disclosure.

FIGS. 4 to 5 have been simplified for a better understanding of the inventive concepts of the present disclosure. In FIGS. 4 to 5, elements with the same labeling numbers as those in FIGS. 1 to 2 are previously discussed with reference thereto and are not repeated here for simplicity.

Referring to FIG. 4, the composition 10 is dispensed on the semiconductor substrate 20 including the patterned base layer 21, the film 22 and the metal containing layer 23. In some embodiments, each plasmonic particles 13 of the composition 10 includes the body 14 and the functional group 18. In certain embodiments, the semiconductor substrate 20 includes several dies, where each of which has active and passive devices using semiconductor manufacturing processes described above.

Referring to FIG. 5, the film 22 is removed from the metal containing layer 23. In particular, the film 22 is polished by the polishing pad 131 as shown in FIG. 1 and then the abrasive particles 11 grind and flush away unwanted film 22 residue. Since the functional group 18 is capable of forming hydrogen bonds with the metal containing layer 23, several plasmonic particles 13 are attached on the metal containing layer 23.

In FIG. 5, the incident light 15 is emitted toward the semiconductor substrate 20. A portion of energy from the incident light 15 is transferred by the body 14 of the plasmonic particle 13 into a surface plasmon resonance or the plasmonic wave 16, which is received by the metal containing layer 23 or the endpoint layer. In some embodiments, the surface plasmon resonance has a wavelength from about 300 nm to about 430 nm. In certain embodiments, the surface plasmon resonance has a wavelength from about 345 nm to about 628 nm. In other embodiments, the surface plasmon resonance has a wavelength from about 412 nm to about 700 nm. In still other embodiments, the surface plasmon resonance has a wavelength from about 325 nm to about 689 nm.

In some embodiments as in FIG. 5, the metal containing layer 23 is capable of transferring the surface plasmon resonance into the fluorescence 17. Subsequently, the fluorescence 17 is emitted away from the metal containing layer 23 of the semiconductor substrate 20. Referring back to FIG. 1, the fluorescence 17 is transmitted through the viewing window 134 to the detector 137, and thus the fluorescence 17 is detected. In addition, as the plasmonic particles 13 accumulate on the metal containing layer 23, the luminous flux of the fluorescence 17 will be more easily detected or sensed. In other words, the fluorescence is sensed in accordance with the number of the plasmonic particles 13 atop the metal containing layer 23.

Figure 6:
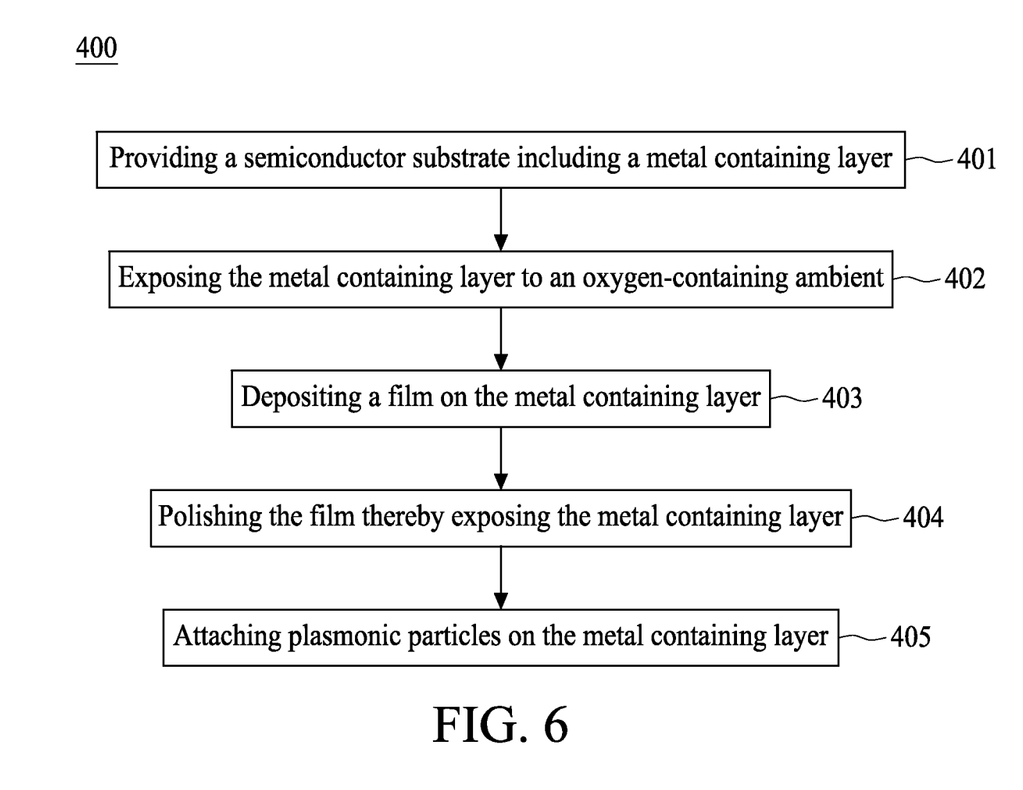
FIG. 6 is a flowchart of a method for providing a semiconductor substrate including a metal containing layer, and exposing the metal containing layer to an oxygen-containing ambient condition in accordance with some other embodiments of the present disclosure.

FIG. 6 is a diagram of a method 400 for chemical mechanical polishing in accordance with some embodiments of the present disclosure. The method 400 includes several operations, which are discussed in detail with reference to FIGS. 7 to 10. At operation 401, a semiconductor substrate including a metal containing layer is provided. At operation 402, the metal containing layer is exposed to an oxygen-containing ambient condition. At operation 403, a film is deposited on the metal containing layer. At operation 404, the film is polished, thereby exposing the metal containing layer. At operation 405, several plasmonic particles are attached on the metal containing layer.

FIGS. 7 to 10 have been simplified for a better understanding of the inventive concepts of the present disclosure. In FIGS. 7 to 10, elements with the same labeling numbers as those in FIGS. 1 to 2 are previously discussed with reference thereto and are not repeated here for simplicity.

Figure 7:
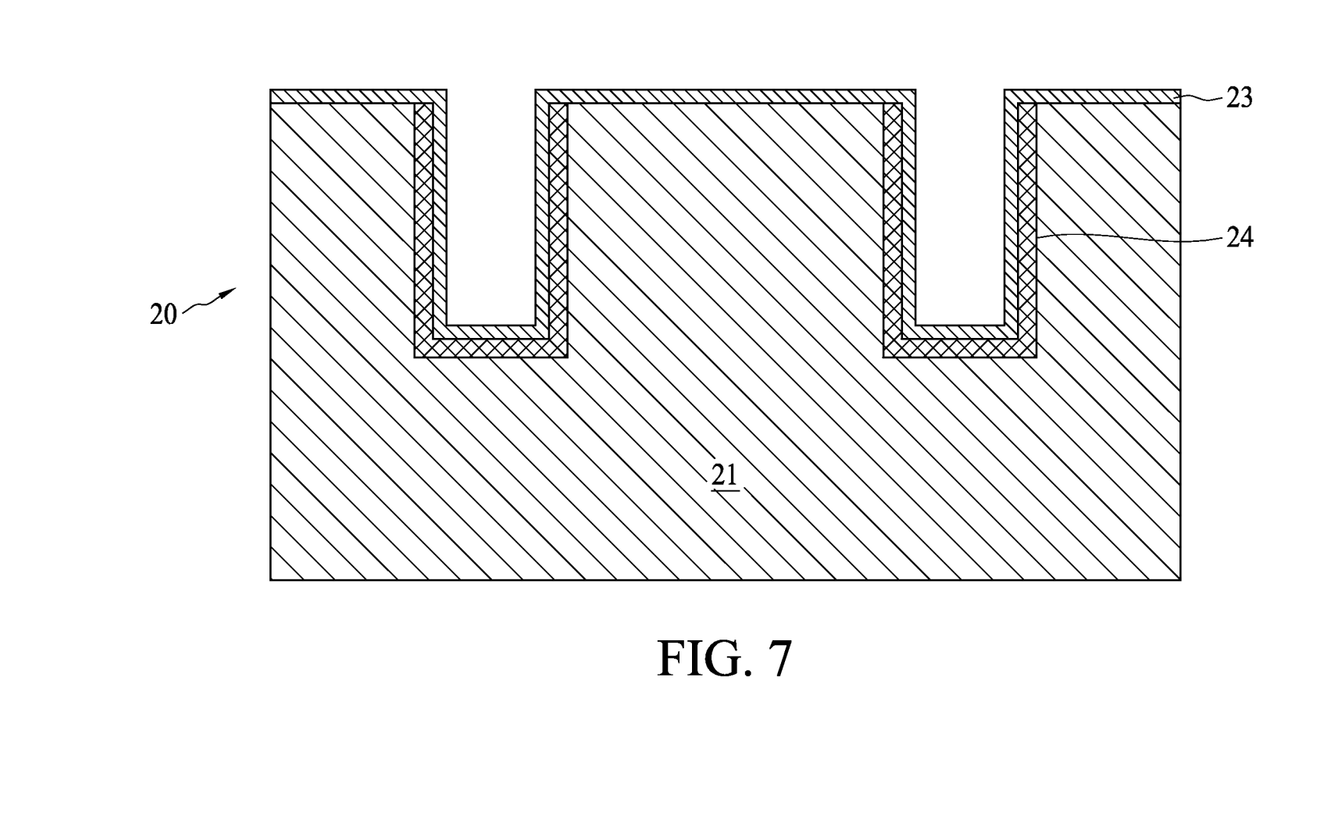
FIG. 7 is a cross-sectional view of providing a semiconductor substrate including a patterned base layer, the metal containing layer, and a preprocessed layer in accordance with some other embodiments of the present disclosure.

Referring to FIG. 7, a semiconductor substrate 20 is provided and includes the patterned base layer 21, the metal containing layer 23 and a preprocessed layer/layers 24.

Figure 8:
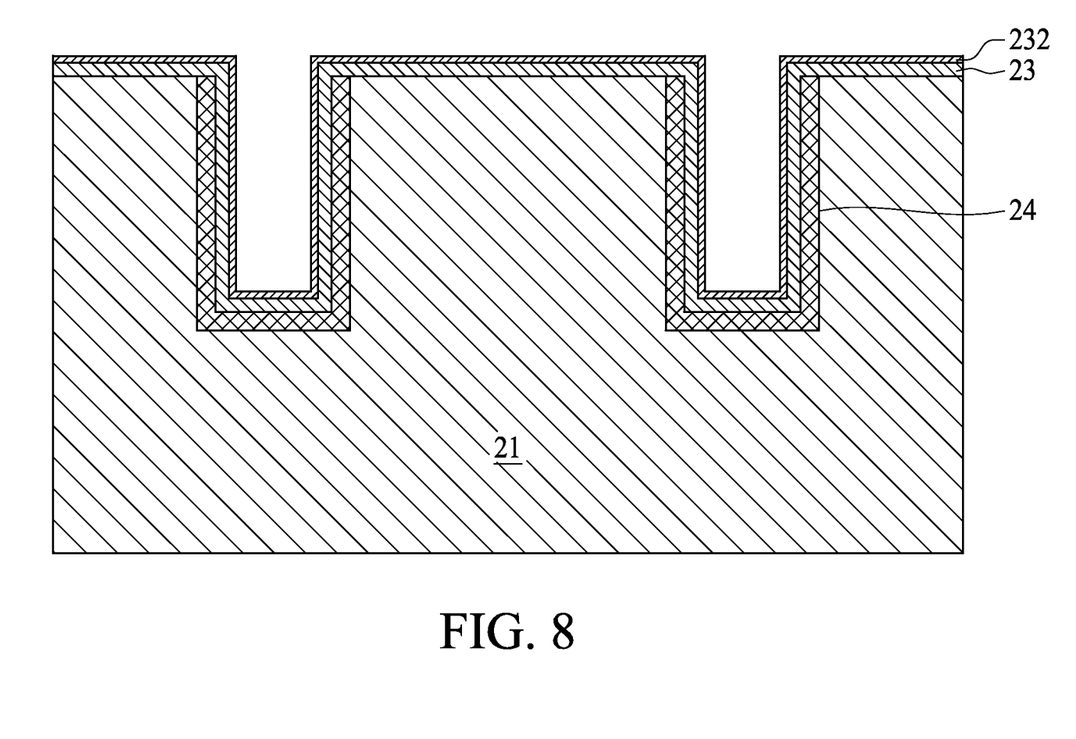
FIG. 8 is a cross-sectional view of exposing a semiconductor substrate including the patterned base layer, the metal containing layer, and the preprocessed layer under an oxygen-containing ambient condition in accordance with some other embodiments of the present disclosure.

Referring to FIG. 8, the metal containing layer 23 is exposed under an oxygen-containing ambient condition which oxidizes a surface 233 of the metal containing layer 23. In some embodiments, the pressure of the oxygen-containing ambient condition affects the thickness of the native oxide layer 232. In some embodiments, the pressure of the oxygen-containing ambient condition is between about 14 psi and about 29 psi. In certain embodiments, the pressure is between about 11 psi and about 32 psi. In other embodiments, the pressure is between about 17 psi and about 42 psi. In still some embodiments, the pressure is between about 9 psi and about 38 psi.

Figure 9:
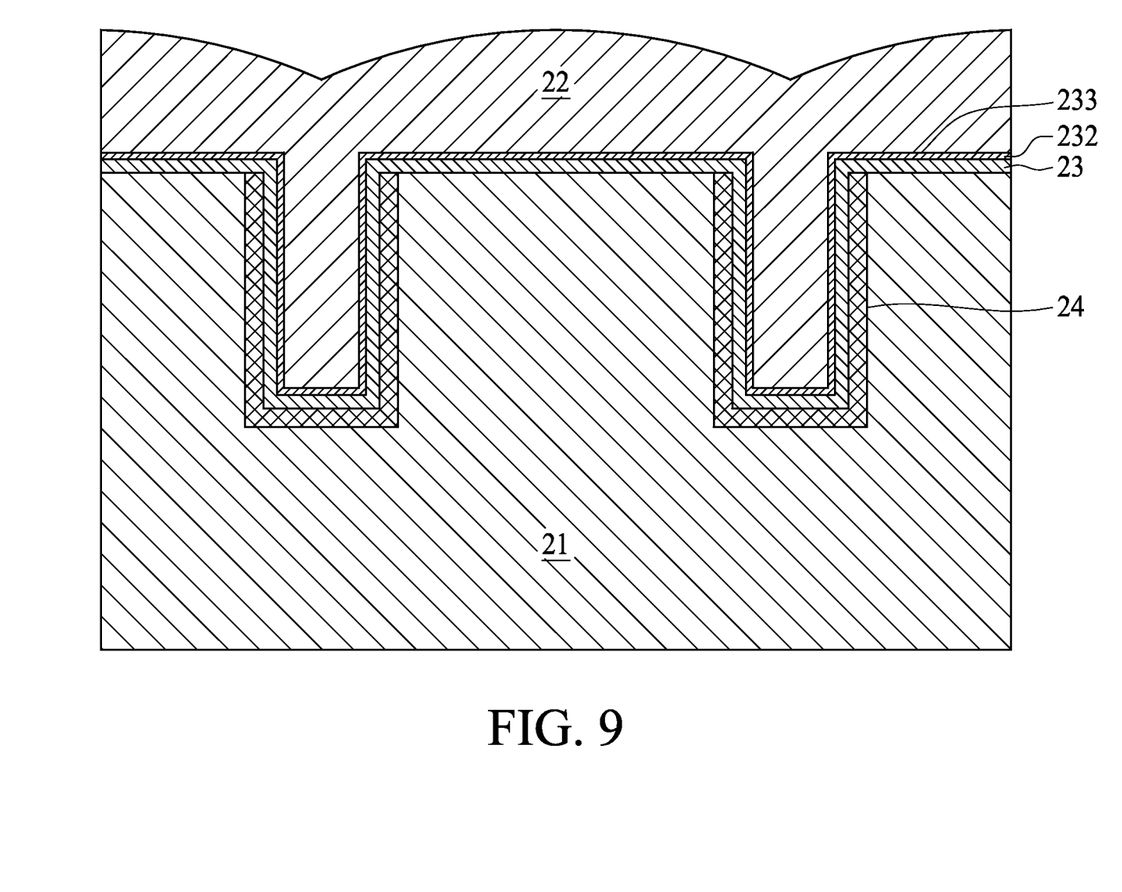
FIG. 9 is a cross-sectional view of depositing a film on a semiconductor substrate including the patterned base layer, the metal containing layer, and the preprocessed layer in accordance with some other embodiments of the present disclosure.

Referring to FIG. 9, a film 22 is deposited on the native oxide layer 232 and the metal containing layer 23. The film 22 includes a topographic surface or the polishing surface 221, which is further polished by the polishing pad 131 shown in FIG. 1 and ground by the abrasive particles 11 of the composition 10.

Figure 10:
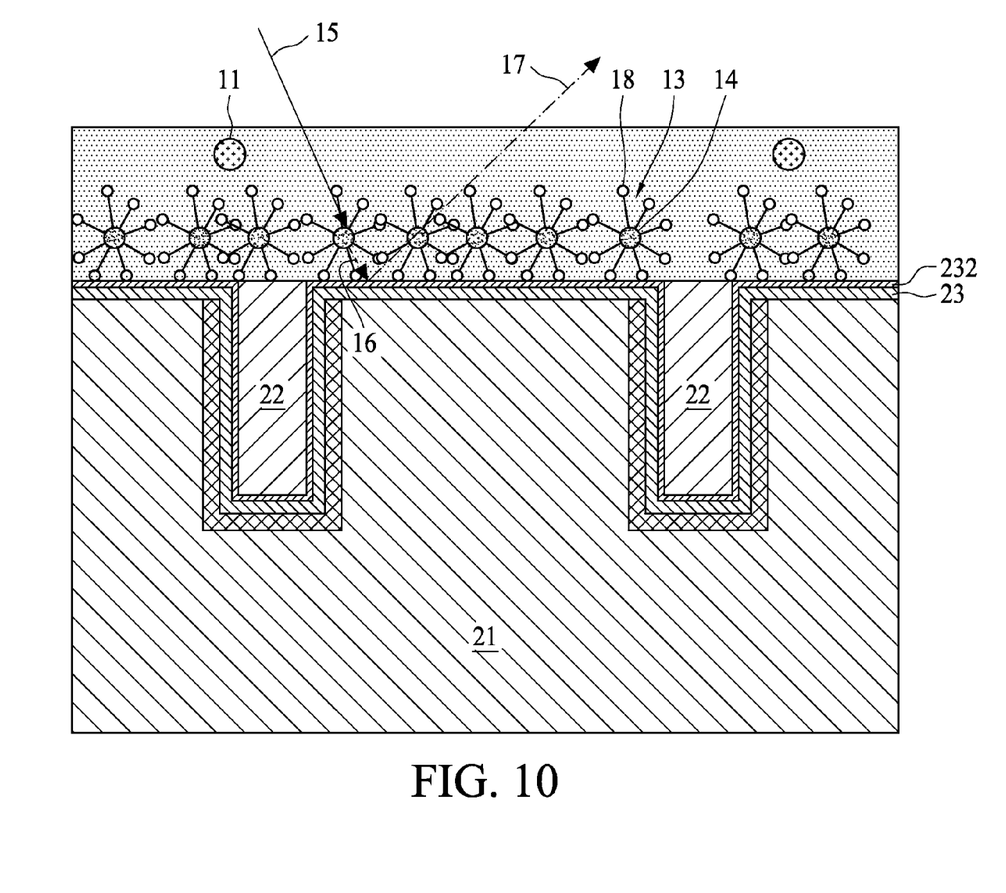
FIG. 10 is a cross-sectional view of polishing a film on a semiconductor substrate including the patterned base layer, the metal containing layer, and the preprocessed layer, thereby exposing the metal containing layer in accordance with some other embodiments of the present disclosure.

Referring to FIG. 10, the film 22 is polished, thereby exposing the metal containing layer 23 or the native oxide layer 232. In some embodiments, the hydrogen element of the functional group 18 of the plasmonic particles 13 is bound to a highly electronegative atom, such as nitrogen (N), oxygen (O) or fluorine (F) of the native oxide layer 232 to form a hydrogen bond. Since several hydrogen bonds are formed between the oxidized surface or the native oxide layer 232 and the functional group 18, a large number of plasmonic particles 13 accumulate or bind on the oxidized surface. In other words, the functional group 18 is used to attach plasmonic particle 13 on the native oxide layer 232 of the metal containing layer 23. Thus, as more area of the film 22 is polished or as the metal containing layer 23 becomes more exposed, the amount of the plasmonic particles 13 attaching to the oxidized surface or the native oxide layer 232 increases.

In some embodiments, the plasmonic particle 13 further includes a metallic body or the body 14. The metallic body includes aluminum (Al), chromium (Cr), molybdenum (Mo), platinum (Pt), tantalum (Ta), silver (Ag), titanium (Ti), tungsten (W), copper (Cu), gold (Au), or a combination thereof. The metallic body of the plasmonic particle 13 is enabled to receive a portion of energy from the incident light 15 and then generates a plasmonic beam or the plasmonic wave 16. In certain embodiments, the plasmonic beam or the plasmonic wave 16 fails to transmit at a long distance, but is capable of traveling around the plasmonic particle 13. Since the plasmonic particle 13 is attached to the oxidized surface or the native oxide layer 232, the plasmonic beam or the plasmonic wave 16 is capable of reaching the oxidized surface or the native oxide layer 232. Furthermore, the oxidized surface or the native oxide layer 232 is designed to transfer the plasmonic beam into the fluorescence 17, which is able to transmit at a long distance. Hence, the fluorescence 17 is accessible to the detector 137 shown in FIG. 1.

In some embodiments, although the fluorescence 17 is able to transmit to the detector, the luminous flux of the fluorescence 17 is too weak at the beginning to be detected. As more plasmonic particles 13 are attached to the oxidized surface of the metal containing layer, the luminous flux of the fluorescence 17 is increased. Once the luminous flux of the fluorescence 17 reaches the detecting threshold of the detector 137, the detector 137 "sees" the fluorescence 17 and then transmits the stop signal in order to stop the film 22 polishing. In other words, the film 22 polishing step is stopped according to the luminous flux of the fluorescence 17. By such design, the over-polishing of the metal containing layer or the endpoint layer is avoided even if the thickness of the metal containing layer 23 is too thin to be detected by the optical reflection.

In some embodiments, a composition for chemical mechanical polishing includes several particles and several abrasive particles. Each of the particles includes a body and a functional group. The body is configured to transfer energy of an incident light into a plasmonic wave. The functional group is configured to bind onto a metal containing layer.

In some embodiments, a method includes dispensing a composition on a semiconductor substrate including a metal containing layer and a film atop the metal containing layer. The method also includes removing the film from the metal containing layer. The method also includes emitting an incident light toward the semiconductor substrate. The method also includes detecting a fluorescence emitted from the semiconductor substrate.

In some embodiments, a method includes providing a semiconductor substrate including a metal containing layer. The method also includes exposing the metal containing layer to an oxygen-containing ambient condition. The method also includes depositing a film on the metal containing layer. The method also includes polishing the film, thereby exposing the metal containing layer. The method also includes attaching a plurality of plasmonic particles on the metal containing layer.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

As used in this application, "or" is intended to mean an inclusive "or" rather than an exclusive "or." In addition, "a" and "an" as used in this application are generally to be construed to mean "one or more" unless specified otherwise or clear from context to be directed to a singular form. Furthermore, to the extent that "includes", "having", "has", "with", or variants thereof are used in either the detailed description or the claims, such terms are intended to be inclusive in a manner similar to "comprising".

What is claimed is:

1. A method, comprising:
    dispensing a composition (10) on a semiconductor substrate (20) including a metal containing layer (23) and a film (22) atop the metal containing layer;
    removing the film from the metal containing layer;
    emitting an incident light (15) toward the semiconductor substrate; and
    detecting a fluorescence (17) emitted from the semiconductor substrate;
    wherein a plurality of plasmonic particles (13) of the composition includes a metallic body (14) and a functional group (18).

2. The method of claim 1, further comprising attaching the plurality of plasmonic particles (13) of the composition (10) on the metal containing layer.

3. The method of claim 1, further comprising transferring a portion of energy from the incident light into a surface plasmon resonance (16).

4. The method of claim 3, further comprising transferring the surface plasmon resonance into the fluorescence.

5. The method of claim 2, further comprising sensing the fluorescence in accordance with the number of the plurality of plasmonic particles on the metal containing layer.

6. The method of claim 3, further comprising generating the surface plasmon resonance with a wavelength from about 300 nm to about 700 nm.

7. A method, comprising:
    providing a semiconductor substrate (20) including a metal containing layer (23);
    exposing the metal containing layer to an oxygen-containing ambient condition;
    depositing a film (22) on the metal containing layer;
    polishing the film (22) to thereby expose the metal containing layer (23); and
    attaching a plurality of plasmonic particles (13) on the metal containing layer;
    wherein the plurality of plasmonic particles includes a metallic body (14) and a functional group (18).

8. The method of claim 7, further comprising transferring a plasmonic beam (16) from the plurality of plasmonic particles into a fluorescence (17) from the metal containing layer (23).

9. The method of claim 7, further comprising stopping the film polishing step according to a luminous flux of the fluorescence (17).

10. The method of claim 8, further comprising generating the plasmonic beam through a metallic body of each of the plurality of plasmonic particles.

11. The method of claim 7, further comprising oxidizing a surface (233) of the metal containing layer.

12. The method of claim 11, further comprising binding the plurality of plasmonic particles on the oxidized surface of the metal containing layer.

13. The method of claim 11, further comprising forming a hydrogen bond between the oxidized surface of the metal containing layer and the functional group of each of the plurality of plasmonic particles.

14. The method of claim 2, wherein the attaching the plurality of plasmonic particles (13) of the composition (10) on the metal containing layer comprises attaching Au, Cu, Ag, Pt, or a combination thereof on the metal containing layer.

15. The method of claim 14, wherein the attaching the plurality of plasmonic particles (13) of the composition (10) on the metal containing layer further comprises attaching the functional group (18) of the composition on the metal containing layer.

16. The method of claim 15, wherein the functional group (18) includes —COOH, —$SO_3H$, —$NH^+$, —OH or a combination thereof.

17. The method of claim 1, wherein the removing the film from the metal containing layer comprises using a plurality of abrasive particles of the composition to remove the film from the metal containing layer.

18. The method of claim 7, wherein the attaching the plurality of plasmonic particles (13) on the metal containing layer comprises attaching Au, Cu, Ag, Pt, or a combination thereof on the metal containing layer.

19. The method of claim 12, wherein the binding the plurality of plasmonic particles on the oxidized surface of the metal containing layer comprises using the functional group (18) to bind the plurality of plasmonic particles on the oxidized surface of the metal containing layer.

20. The method of claim 19, wherein the functional group (18) includes —COOH, —$SO_3H$, —$NH^+$, —OH or a combination thereof.

* * * * *